(12) United States Patent  
Higuchi

(10) Patent No.: US 7,109,540 B2
(45) Date of Patent: Sep. 19, 2006

(54) SEMICONDUCTOR DEVICE FOR RESTRAINING SHORT CIRCUITING AND METHOD OF MANUFACTURING THEREOF

(75) Inventor: Toshihiko Higuchi, Kai (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/984,673

(22) Filed: Nov. 9, 2004

(65) Prior Publication Data

US 2005/0161723 A1 Jul. 28, 2005

(51) Int. Cl.
H01L 29/76 (2006.01)

(52) U.S. Cl. ............... 257/295; 257/213; 257/288; 257/E27.104; 257/E21.663; 438/3

(58) Field of Classification Search .............. None
See application file for complete search history.

(56) References Cited

U.S. PATENT DOCUMENTS 5,708,559 A * 1/1998 Brabazon et al.
6,166,424 A * 12/2000 Mikawa et al.
6,452,251 B1 * 9/2002 Bernstein et al.
6,690,598 B1 2/2004 Oguchi
2003/0098466 A1 5/2003 Morozumi

FOREIGN PATENT DOCUMENTS

| JP | 11-087633 | 3/1999 |
| JP | 2001-284679 | 10/2001 |
| JP | 2002-026285 | 1/2002 |
| JP | 2003-133522 | 5/2003 |

* cited by examiner

Primary Examiner—Nathan J. Flynn
Assistant Examiner—Kevin Quinto
(74) Attorney, Agent, or Firm—Harness, Dickey & Pierce, P.L.C.

(57) ABSTRACT

A method of manufacturing a semiconductor device is provided including: forming a groove in an insulation film; forming a lower electrode material film on the insulation film and in the groove; forming a ferroelectric material film on the lower electrode material film, on the insulation film and in the groove; forming an upper electrode material film on the ferroelectric material film, on the insulation film and in the groove; forming a capacitive element within the groove by removing the upper electrode material film and the ferroelectric material film from the insulation film and leaving the upper electrode material film and the ferroelectric material film within the groove by CMP-polishing the insulation film and the groove.

12 Claims, 6 Drawing Sheets

PRIOR ART

SEMICONDUCTOR DEVICE FOR RESTRAINING SHORT CIRCUITING AND METHOD OF MANUFACTURING THEREOF

RELATED APPLICATIONS

This application claims priority to Japanese Patent Application No. 2003-379265 filed Nov. 10, 2003 which is hereby expressly incorporated by reference herein in its entirety.

BACKGROUND

1. Technical Field

The present invention relates to a semiconductor device and a method of manufacturing thereof. The present invention, in particular, relates to a semiconductor device and a method of manufacturing for promoting miniaturization. Further, the present invention, in particular, relates to a semiconductor device and a method of manufacturing for restraining short circuiting among electrodes and wirings.

2. Related Art

FIG. 6 shows a sectional view of a conventional semiconductor device. This semiconductor device includes a nonvolatile memory (ferroelectric random-access memory, Fe RAM) using a ferroelectric capacitor as a capacitive element and is manufactured by the following method (See Unexamined patent publication 2003-133522), for example.

Firstly, a MOS transistor is formed on a silicon substrate 101. Namely, an element isolation film 102 is formed on the silicon substrate 101 by a LOCOS method and a gate oxide film 103 in the element region located between mutual points of element isolation film 102 is formed by thermal oxidization. Next, polysilicon film is deposited on a region including the gate oxide film 103 and patterned so as to form a gate electrode 104 on the gate oxide film 103. Next, impurity ions are ion-implanted to the silicon substrate with the gate electrode as a mask. Next, a sidewall 105 is formed at the side of the gate electrode 104 and impurity ions are ion-implanted with the sidewall and the gate electrode as masks and a given thermal treatment is completed. Therefore, a low concentration diffusion layer 106 is formed in a lightly doped drain (LDD) region of the silicon substrate 101 and an impurity layer 107 as a source diffused region and a drain diffused region are formed in the source/drain region in the silicon substrate 101.

Next, a first conductive layer, a ferroelectric layer and a second conductive layer are deposited in this order on all surfaces of the MOS transistors and the element isolation layer 102 and patterned so as to form a capacitive element including a lower electrode 110, a ferroelectric material film 111 and an upper electrode 112.

Next, an interlayer insulation film 113 is deposited on all surfaces including the capacitive element and the MOS transistor. Next, a contact bore or hall located on the impurity layer 107 and a contact hall located on the upper electrode 112 are formed on the interlayer insulation film 113. Next, an aluminum alloy film is deposited within the contact hall and on the interlayer insulation film 113 and patterned. Hence, an aluminum alloy wiring 114 connected to the impurity layer 107 and the upper electrode 112 is formed on the interlayer insulation film 113.

In the capacitive element, the upper electrode and the lower electrode require heat resistance so heat resistant metal such as platinum is used. Platinum has high resistance to reaction and corrosion as well as heat resistance. Hence, when the lower electrode, the ferroelectric electrode and the upper electrode are patterned in the same process, etching having physical strength such as ion milling is needed instead of common reactive ion etching (RIE).

However, a taper is easily formed if etching having physical strength is used. Thus, it is difficult to promote miniaturization for a capacitive element. Further, particles are easily formed when etching so that the upper electrode 112 and the lower electrode 110 are short-circuited and the aluminum wiring is also short-circuited. In view of the above situation, the present invention is intended to provide a semiconductor device and a method of manufacturing to promote miniaturization. Further, the present invention is intended to provide a semiconductor device and a method of manufacturing for restraining short circuiting.

SUMMARY

In order to overcome the above issues, a method of manufacturing a semiconductor device of the present invention comprises: forming an groove in a insulation film; forming a lower electrode material film on the insulation film and within the groove; forming a ferroelectric material film on the lower electrode material film within the insulation film and the groove; forming an upper electrode material film on the ferroelectric material film located on the insulation film and within the groove; forming an upper electrode and a ferroelectric material film within the groove by removing the upper electrode material film and the ferroelectric material film from the insulation film and leaving the upper electrode material film and the ferroelectric material film within the groove by chemical mechanical polishing (CMP-polishing) the insulation film and the groove.

According to the method of manufacturing a semiconductor device, the upper electrode and the ferroelectric material film of the capacitive element are formed within the groove by removing the upper electrode material film and the ferroelectric material film from the insulation film and pattering them by CMP-polishing. Thus, there is no need for ion milling when patterning the upper electrode material film and the ferroelectric material film. Therefore, there are fewer amounts of particles so as to restrain short circuiting between the upper electrode and the lower electrode. Further, the short circuit between the upper electrode and the wiring to connect the lower electrode to the outer portion can be restrained.

In the step of removing the upper electrode material film and the ferroelectric material film at least a part of the lower electrode material film on the insulation film may be left so as to be continuous from the groove and form the lower electrode of the capacitor element. Thus, the lower electrode of the capacitive element can be connected to the outer portion at the upper area of insulation film. Therefore, the lower electrode can be connected to the wiring with a simple structure. In this case, in the step of forming the lower electrode material film, the lower electrode material film may be formed with sputtering or a CVD method. According to the method, it is easy to form the lower electrode material film without disconnecting from the inside of the groove to the upper surface of the insulation film. In the step of forming the groove, a taper may be formed at the side of the groove and the interface between the side and the bottom of the groove may be curved. Thus, it can be difficult to disconnect the lower electrode material film at the side of the groove and the interface between the side and the bottom of the groove when forming the lower electrode.

Another method of semiconductor device of the present invention comprises: forming a first groove in a insulation film; forming a second groove at the bottom of the first groove; forming a lower electrode material film on the surface of the insulation film, within the first groove and the second groove; forming a ferroelectric material film at the insulation film, the first groove and the second groove; forming an upper electrode material film on the ferroelectric material film at the insulation film, the first groove and the second groove; forming a capacitive element within the second groove and exposing the lower electrode material film at the first groove by removing the upper electrode material film, the ferroelectric material film and the lower electrode material film from the insulation film and removing the upper electrode material film and the ferroelectric material film from the upper surface of the first groove by CMP-polishing the insulation film and the upper surfaces of the first and second grooves.

According to the method of manufacturing a semiconductor device, the capacitive element is formed within the second groove by removing the upper electrode material film and the ferroelectric material film, formed on the insulation film and pattering them by CMP-polishing. Thus, there is no need for ion milling when patterning the upper electrode material film and the ferroelectric material film and the lower electrode material film. Therefore, there are fewer particles which restrain short circuiting between the upper electrode and the lower electrode. Further, short circuiting between the upper electrode and the wiring to connect the lower electrode to the outer portion can be restrained. Further, it is not difficult to form a taper along the sides of the upper electrode, the ferroelectric film and the lower electrode so as to miniaturize the capacitive element.

In the step of forming the lower electrode material film, the thickness of the lower electrode material film is greater than the depth of the first groove at the first groove. Thus, the upper electrode, the ferroelectric material film can be certainly removed from the first groove when removing the upper electrode, the ferroelectric material film, and the lower electrode from the insulation film. In the step of removing the upper electrode material film and the ferroelectric film the lower electrode material film formed on the first groove may be left so as to be continuous from the inside of the groove. Thus, the lower electrode of the capacitive element can be connected to the outer portion at the upper area of insulation film so as to connect the lower electrode to the wiring with a simple structure.

A semiconductor device of the present invention comprises: a groove formed on the insulation film; a lower electrode formed to be continuous from at least a part of the surface of the insulation film to the inside of the groove; a ferroelectric film formed within the groove and on the lower electrode; and an upper electrode formed within the groove and on the ferroelectric film.

A semiconductor device of the present invention comprises: a first groove formed on the insulation film; a second groove formed at the bottom of the first groove; a lower electrode formed to be continuous from at least a part of the bottom surface of the first groove to the inside of the second groove; a ferroelectric film formed within the second groove and on the lower electrode; and an upper electrode formed within the second groove and on the ferroelectric film.

A method of manufacturing a semiconductor device of the present invention comprises; forming a transistor on a substrate; forming an insulation film on the substrate; forming a groove in the insulation film; forming a lower electrode material film on the insulation film and within the groove; forming a ferroelectric material film on the lower electrode material film on the insulation film and within the groove; forming an upper electrode material film on the ferroelectric material film located on the insulation film and within the groove; forming a capacitive element within the groove by removing the upper electrode material film and the ferroelectric material film from the insulation film and leaving the upper electrode material film and the ferroelectric material film within the groove by CMP-polishing the insulation film and the groove and forming a wiring electrically coupling the capacitive element with the transistor.

Another method of manufacturing a semiconductor device of the present invention comprises: forming a transistor on a substrate; forming an insulation film on the substrate; forming a first groove in the insulation film; forming a second groove at the bottom of the first groove; forming a lower electrode material film on the surface of the insulation film and within the first and second grooves; forming a ferroelectric material film on the lower electrode material film located on the insulation film and within the first and second grooves; forming an upper electrode on the ferroelectric material film located on the insulation film and within the first and second grooves; forming a capacitive element within the second groove and exposing the lower electrode material film at the first groove by removing the upper electrode material film, the ferroelectric material film, and the lower electrode material film from the insulation film and removing the upper electrode material film and the ferroelectric material film from the upper surface of the first groove by CMP-polishing the insulation film and the first and second grooves, and forming a wiring electrically coupling the capacitive element with the transistor.

A semiconductor device of the present invention comprises: a groove formed on the insulation film; a lower electrode of a capacitive element formed to be continuous from at least a part of the surface of the insulation film to the inside of the groove; a ferroelectric film of the capacitive element formed within the groove and on the lower electrode; and an upper electrode of the capacitive element formed on the ferroelectric film and within the groove, wherein the capacitive element including the upper electrode, the ferroelectric film and the lower electrode is coupled to a transistor.

A semiconductor device of the present invention comprises: a first groove formed on the insulation film; a second groove formed at the bottom of the first groove; a lower electrode formed to be continuous from at least a part of the bottom surface of the first groove to the inside of the second groove; and a ferroelectric film formed within the second groove and on the lower electrode; an upper electrode formed within the second groove and on the ferroelectric film, wherein a capacitive element including the upper electrode, the ferroelectric film, and the lower electrode is coupled to a transistor.

DETAILED DESCRIPTION

The preferred embodiments of the invention are explained referring to the figures. FIGS. 1 and 2 show cross sections of a method of manufacturing a semiconductor device of the first embodiment. This semiconductor device is a non-volatile memory using a ferroelectric capacitor.

Figure 1A:
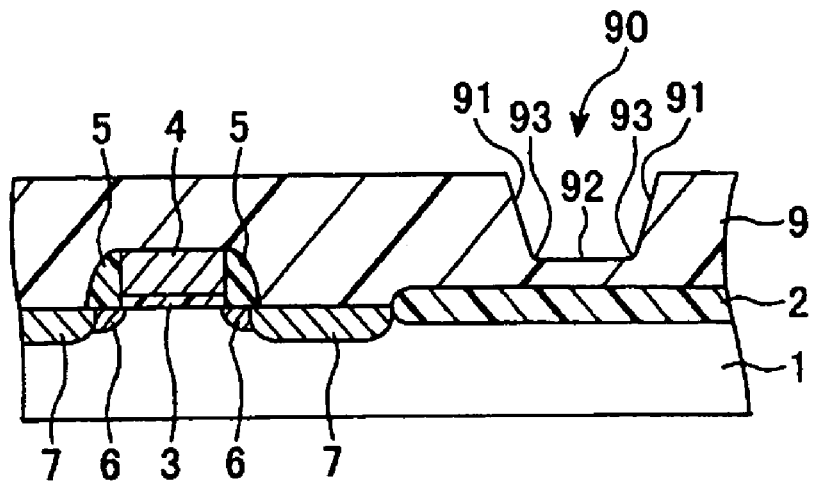
FIG. 1A to FIG. 1C show a method of manufacturing a semiconductor device of the first embodiment.

Firstly, a MOS transistor is formed on a silicon substrate 1 shown in FIG. 1A. Namely, an element isolation layer 2 is formed on the silicon substrate 1 by a LOCOS method. A gate oxide layer 3 is formed in the element region among portions of the element isolation layer 2. Next, polysilicon film is deposited on a region including the surface of the gate oxide film 3 by chemical vapor deposition (CVD) and patterned so as to form a gate electrode 3 on the gate oxide film 4. Next, impurity ion is ion-implanted to the silicon substrate 1 with the gate electrode 4 as a mask. Next, a sidewall 5 is formed at the side of the gate electrode 4 and impurity ion is ion-implanted with the sidewall 5 and the gate electrode 4 as masks and a given thermal treatment is completed. Therefore, a low concentration diffusion layer 6 is formed in a LDD region of the silicon substrate an impurity material layer 7 as a source diffused region and a drain diffused region is formed on the source/drain regions in the silicon substrate 1.

Next, a first interlayer insulation film 9 is deposited on all surfaces including the MOS transistor and the element isolation layer 2 by a CVD method. The first interlayer insulation film 9 is a silicon oxide film for example and its thickness is from 500 to 1000 nm. Next, a groove 90 is formed in the first interlayer insulation film 9. The groove 90 is formed as follows, for example. Firstly, a photoresist film (not shown in the figure) is coated on the first interlayer insulation film 9, exposed to light and developed so as to form a resist pattern on the first interlayer insulation film 9. Next, the groove 90 is formed in the first interlayer insulation film 9 by etching the first interlayer insulation film 9 with the resist pattern as a mask. The groove 90 is formed by dry etching for example. Here, the desired depth of the groove 90 can be attained by controlling the etching time, for example.

Here, a side 91 of the groove 90 is preferably tapered. In order to form a taper at the side 91, the groove 90 is formed by etching the first interlayer insulation film 9 with plasma using $CHF_3+Ar$, $CF4+Ar$ or $CHF_3+CF_4+Ar$ for example or these combinations. Further, an interface 93 between the side 91 and the bottom 92 is preferably smoothed to form a curved or rounded boundary. In order to smooth and round the interface 93, the inside of the groove 90 is over etched with plasma using $CF_4+O_2$ for example.

Figure 1B:
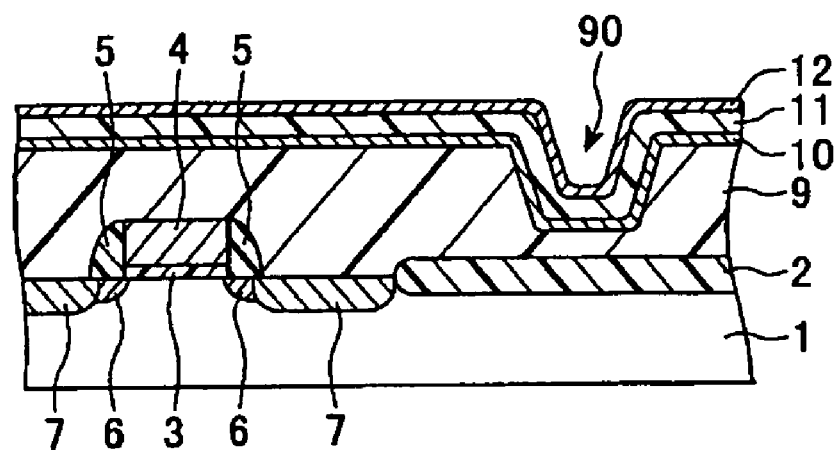

Next, a lower electrode material film 10 is formed in the groove 90 and on the first interlayer insulation film 9 as shown in FIG. 1B. The lower electrode material film 10 is a multi-layered film composed of platinum or tungsten (W), for example, and formed with a thickness from about 100 to 300 nm by an isotropic method such as metal CVD or sputtering for example. The lower electrode film material 10 is preferably formed without disconnecting from the surface of first interlayer insulation film 9 to the inside of the groove 90. If the lower electrode material film 10 is formed by an isotropic method, the lower electrode material film 10 is continuously formed without disconnection. If the inside 91 of the groove 90 is tapered, the lower electrode material film 10 is easily formed within the groove 90 without disconnection. Even if the interface 93 between the side 91 and the bottom 92 is curved, the lower electrode material film 10 is easily formed within the groove 90 without disconnection. If the inside 91 of the groove 90 is tapered and the interface 93 between the side 91 and the bottom 92 is curved, the lower electrode material film 10 is easily formed, particularly within the groove 90 without disconnection.

Next, a ferroelectric material film 11 such as PZT (titanic acid and zirconic acid lead $Pb(Zr,Ti)O_3$ with a perovskite structure), SBT ($SrBi_2$ $(Ta,Nb)_2$ $O_9$), $BST((Ba,Sr)TiO_3)$ is formed by a CVD method or sputtering for example. The thickness of the ferroelectric material film 11 is about 100 to 300 nm in the plane area.

Here, the CVD method is to deposit a ferroelectric material with gaseous materials such as metal salt with O-M combination, metal complex, and metal alkoxide as a row material by heat-decomposing them on the substrate surface heated in the vacuum chamber as well as reacting them with oxygen. Further, in the sputtering, a target such as plural kinds of metals, alloys, plural kinds of oxidized powders or sintered material or oxidized powders, having a composition that is close to the thin film composition, is bombarded with argon ions or oxide ions generated by discharging in a depressurized argon oxide atmosphere. Then, atoms or molecules scatter out from a target into a gaseous phase due to the kinetic momentum of the ions, and a ferroelectric material is deposited from the gaseous phase. At this time, oxygen, which is insufficient in the ferroelectric material, is added by oxidization with oxide in the atmosphere. Using the CVD method and sputtering, the ferroelectric material is crystallized within the deposition when the substrate temperature is high. Further, when the substrate temperature is low, the ferroelectric material is crystallized within the deposition by heating it with high temperature after deposition.

Next, an upper electrode material film 12 such as platinum is formed on the entire surface of the ferroelectric material film 11. The upper electrode film material 12 is formed with a thickness from about 100 to 300 nm by a metal CVD or sputtering method, for example.

Figure 1C:
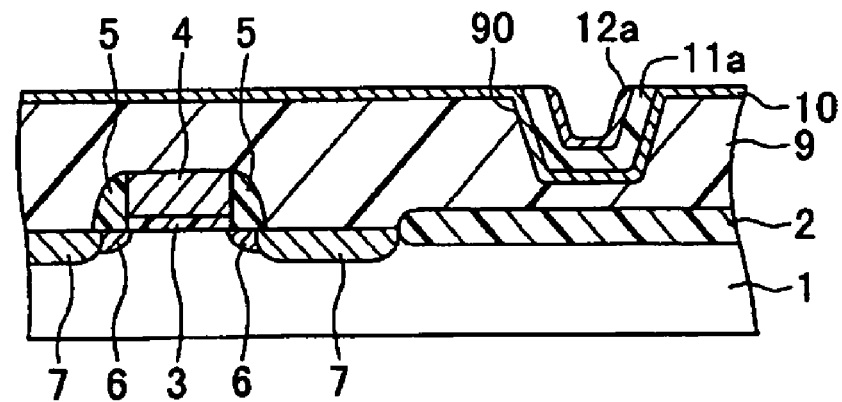

Next, as shown in FIG. 1C, portions of the upper electrode material film 12 and ferroelectric material film 11 formed on the surface of the first interlayer insulation film 9 are polished and removed by CMP. Thus, the upper electrode material film 12 and the ferroelectric material film 11 are patterned and the upper electrode material film 12 and the ferroelectric material film 11 are left within the groove 90 so as to form a ferroelectric film 11a within the groove 90.

Here, when doing CMP, $H_2O_2$ is preferably added as a subsidiary polishing material. Further, in the present embodiment, if a main material of the upper electrode material 12 is platinum, then a material which is resistant to physical polishing such as $K_2Cr_2O_7$ or $KClO_3$ is preferably used as a polishing material since it is difficult to cause a chemical reaction onto the upper electrode material film 12. Depending on the material used for forming the upper electrode material 12, a polishing material including Fe, or one having a strong acid is used.

Here, in the example shown in the figure, the lower material electrode 1 is formed directly on the first interlayer insulation film 9 and in the groove 90. But, it is possible that high melting point metal films such as Ti, Ta, Ir, W or these nitride films or oxide films are formed and the conductive film is formed on them. Further, the upper material electrode 12 is formed directly on the ferroelectric material 11. But, it is possible that high melting point metal films such as Ti, Ta, Ir, W or these nitride films or oxide films are formed and the conductive film is formed as the upper electrode on them. These high melting point metal films, nitride films or oxide films improve the adhesiveness between the lower electrode and its lower layer or the upper electrode and its lower layer and functions to trap oxygen.

Figure 2A:
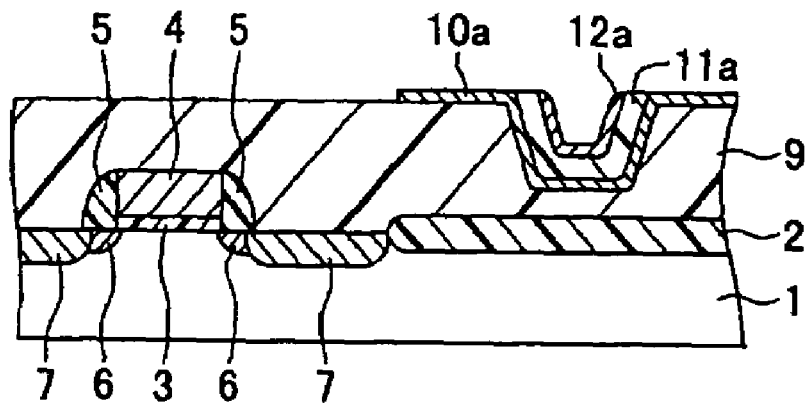
FIG. 2A to FIG. 2C show cross sections of a method of manufacturing a semiconductor device following FIG. 1.
Figure 2B:
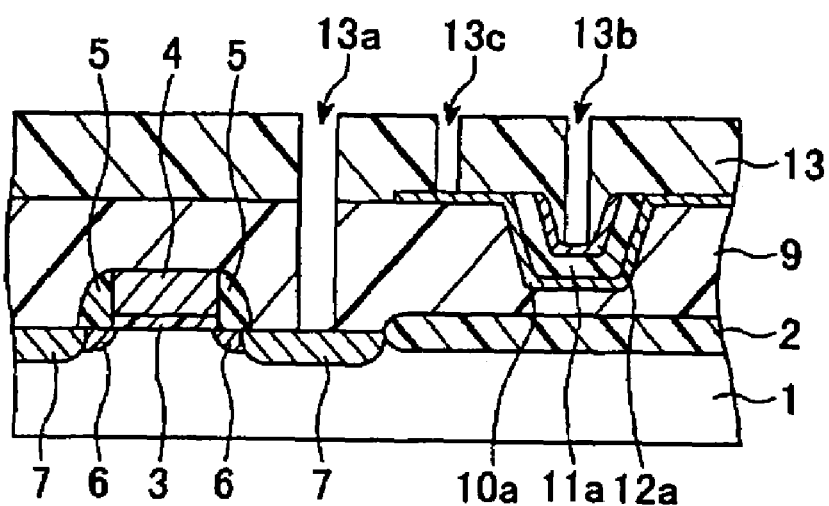

Next, as shown in FIG. 2A, a part of the lower electrode material film 10 located on the MOS transistor is removed by ion milling. Next, as shown in FIG. 2B, the second interlayer insulation film 13 such as a silicon oxide film is deposited on the entire surface including the MOS transistor and the capacitive element by a CVD method. Next, a photo resist film (not shown in the figure) is coated on the second interlayer insulation film 13, exposed to light and developed so as to form a resist pattern on the second interlayer insulation film 13. Next, a contact hole 13a located on the impurity layer 7 is formed by etching the first interlayer insulation film 7 with the resist pattern as a mask. At the time when forming the contact hole 13a, a contact hole 13b located on the upper electrode 12a is formed by etching the second interlayer insulation film 13. Further, a contact hole 13c is formed at the same time as when forming the contact hole 13a so that it is located on an exposed part of the lower electrode 10a over the first interlayer insulation film 9. Here, the contact holes 13a, 13b and 13c may be formed by separate processes.

Figure 2C:
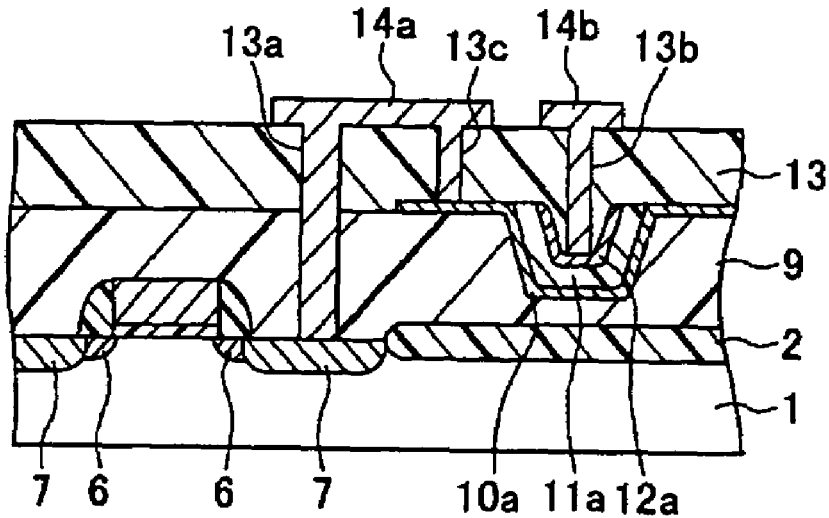

Next, an aluminum alloy film is deposited within these contact bores or halls and on the second interlayer insulation film 2 by sputtering. Next, a photo resist film (not shown in the figure) is coated on the aluminum alloy film, exposed to light and developed so as to form a resist pattern on the aluminum alloy film. Next, as shown in FIG. 2C, an aluminum alloy wiring 14a connected to the impurity layer 7 and the lower electrode 10a and an aluminum alloy wiring 14b connected to the upper electrode 12a are formed by etching the aluminum alloy film with the resist pattern as a mask Thus, the semiconductor device manufactured by the above process has the structure shown in FIG. 2C. Namely, an element isolation film 2 is formed on the silicon substrate 1 and the MOS transistor is formed in the element region located between mutual points of the element isolation film 2. The first interlayer insulation film 9 including the groove 90 is deposited on the element isolation film 2 and the MOS transistor. Within the groove 90, the lower electrode 10a, the ferroelectric film 11a and the upper electrode 12a are formed in this order so as to form the capacitive element. A part of the lower electrode 10a extends to the surface of the first interlayer insulation film 9 to be electrically coupled with the impurity layer 7 of the MOS transistor via the aluminum alloy wiring 14a The upper electrode 12a is electrically coupled to the aluminum alloy wiring 14b.

According to the first embodiment described above, the capacitive element is formed as follows. Namely, the groove 90 is formed in the first interlayer insulation film 9 and the lower electrode material film 10, the ferroelectric material film 11 and the upper electrode material film 12 are deposited in this order on the surface of the first interlayer insulation film 9 and within the groove 90. Next, the ferroelectric material film 11 and the upper electrode material film 12 formed on the surface of the first insulation film 9 are CMP-polished so as to form the upper electrode 12a and the ferroelectric film 11a at the same time. Next, the lower electrode material film 10 is patterned by ion milling so as to form the lower electrode 10a. Thus, in this process, not all of the upper electrode 12a, the ferroelectric film 11a and the lower electrode 10a are patterned by ion milling, but only the lower electrode 10a is patterned by ion milling so as to cause fewer particles. Therefore, the upper electrode 12a and the lower electrode 10a can be restrained from short-circuiting and the aluminum alloy wiring 14a and 14b are also restrained from short-circuiting.

Here, the side surface of the contact holes 13a, 13b and 13c may be tapered to improve the adherence of the aluminum alloy films 14a and 14b. Further, an embedded plug such as tungsten is located within the contact hole so as to surely couple the aluminum wiring. The mechanism for coupling the MOS transistor with the capacitive element is not limited to the above embodiment and can be changed in various ways.

Figure 3A:
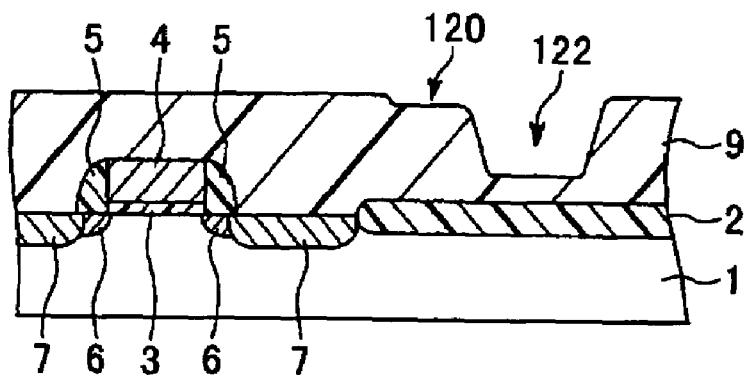
FIG. 3A to FIG. 3D show a method of manufacturing a semiconductor device of the second embodiment.

FIG. 3A to 3D show cross sections of a method of manufacturing a semiconductor device of the second embodiment. The same reference numerals are applied to the same parts as in the first embodiment and only different portions are explained. Firstly, as shown in FIG. 3A, the element isolation film 2 and the MOS transistor are formed and the first interlayer insulation film 9 such as a silicon oxide film is deposited on an entire surface including the MOS transistor and the element isolation film 2. These processes are the same as in the first embodiment.

Next, a first groove 120 is formed in the first interlayer insulation layer 9. The first groove 120 is formed with the same process as used to form the groove 90 in the first embodiment, but its depth is shallower than that of the groove 90. In detail, the depth of the first groove 120 is equivalent to the thickness of the lower electrode (described hereafter) or a little thicker.

Further, a second groove 122 is formed in the bottom of the first groove 120. The second groove 122 is formed as followings. Firstly, a photoresist film (not shown in the figure) is coated on the entire surface of the first interlayer insulation layer 9 including the first groove 120, exposed to light and developed so as to form a resist pattern exposing a part of the bottom of the first groove 120. Next, the second groove 122 is formed in the exposed area of the first groove 120 by etching the first interlayer insulation layer 9 with the resist pattern as a mask. Here, the depth of the second groove 122 is equivalent to the sum of the thickness of the lower electrode 10 and the thickness of the ferroelectric film (described hereafter) or a little thicker than their sum.

Here, a side of the second groove 122 is preferably tapered. Further, it is preferable that the interface between the side and the bottom of the second groove 122 is gently curved. The method of tapering the side and the method of curving the interface between the side and the bottom are the same as in the first embodiment.

Figure 3B:
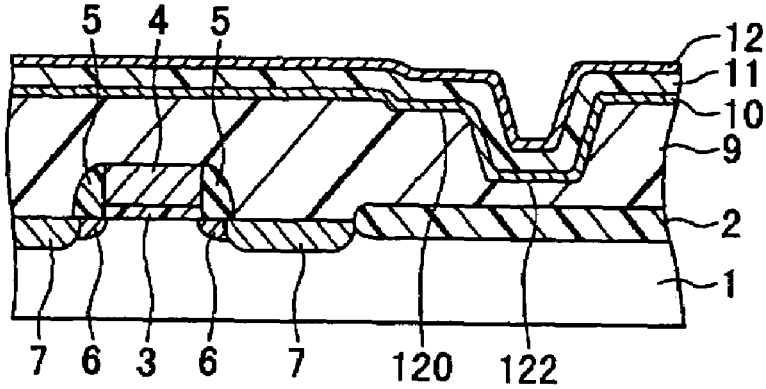

Next, as shown in FIG. 3B, the lower electrode material film 10 is formed in the first groove 120 and the second groove 122 and on the first interlayer insulation layer 9. The lower electrode film material 10 is formed from the first groove 120 to the sides and the bottoms of the second groove 122 without disconnecting. If the side of the second groove 122 is tapered, the lower electrode material film 10 tends to stay connected during formation. Further, when the interface between the side and the bottom is gently curved, the lower electrode material 10 tends to stay connected during formation. If the side of the second groove 122 is tapered and the interface between the side and the bottom is gently curved, the lower electrode material film 10 stays strongly connected during formation.

Further, the ferroelectric material film 11 such as PZT (titanic acid and zirconic acid lead $Pb(Zr,Ti)O_3$ with a perovskite structure), SBT ($SrBi_2(Ta,Nb)_2O_9$), BST(Ba,Sr) $TiO_3$ is formed by a CVD method or sputtering for example. Next, the upper electrode material film 12 is formed on an entire surface of the ferroelectric material film 11. These processes are the same as in the first embodiment.

Figure 3C:
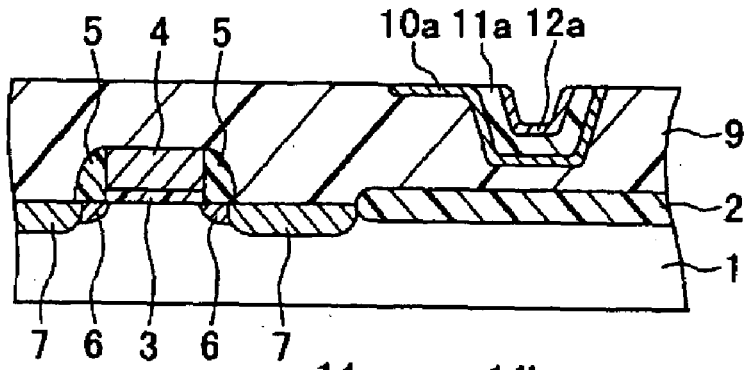

Next, as shown in FIG. 3C, portions of the upper electrode material film 12 and the ferroelectric material film 11 formed on the surface of the first interlayer insulation film 9 are polished and removed by CMP. The polishing material and subsidiary material for CMP are the same as in the first embodiment. Thus, the upper electrode material film 12 and the ferroelectric material film 11 and the lower electrode material film 10 are patterned so as to form the capacitive element comprising the upper electrode 12*a* and the ferroelectric film 11*a* and the lower electrode 10*a* within in the second groove 122. Here, the thickness of the lower electrode 10 is substantially equal to the depth of the groove 120 or thicker. Hence, the upper electrode material film 12 and the ferroelectric material film 11 are surely removed from the first groove 120 and the lower electrode 10*a* is exposed in the first groove 120.

Further, the second interlayer insulation film 13 is deposited on an entire surface including the capacitive element and the MOS transistor. Further, by the same process as in the first embodiment, the contact hole 13*a* located on the impurity layer 7, and the contact hole 13*b* located on the upper electrode 12*a* are formed, and the contact hole 13*c* is formed on a part of the lower electrode 10*a* exposed on the first groove 120. Next, an aluminum alloy film is deposited in the contact holes and on the second interlayer insulation film 13. Then, the aluminum alloy film is patterned by the same process as in the first embodiment so as to form the aluminum alloy wiring 14*a*, coupled to the impurity layer 10*a* and the lower electrode 10*a* and the aluminum alloy wiring 14*b*, coupled to the upper electrode 12*a* on the second interlayer insulation film 13 as shown in FIG. 3D.

Figure 3D:
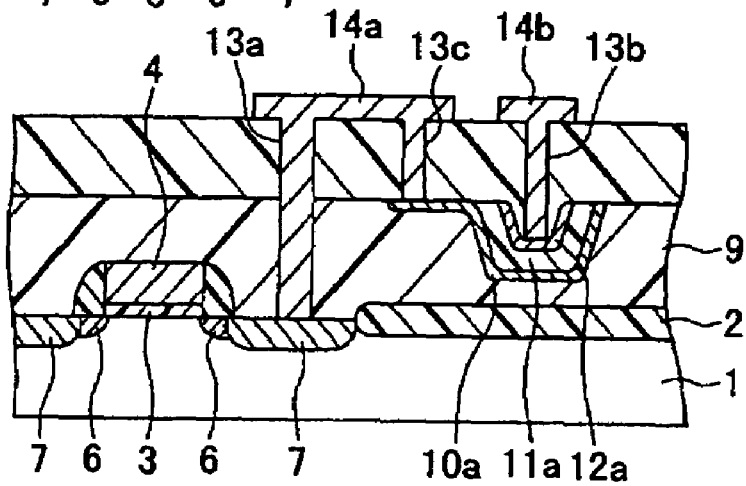

Thus, the semiconductor device manufactured by the above process has the structure shown in FIG. 3D. Namely, the element isolation film 2, the MOS transistor and the first interlayer insulation film 9 are formed on the silicon substrate 1. The first groove 120 and the second groove 122 are formed in the first interlayer insulation film 9. Within the second groove 122, the lower electrode 10*a*, the ferroelectric film 11*a* and the upper electrode 12*a* are formed in this order so as to form the capacitive element. A part of the lower electrode 10*a* extends to the bottom of the first groove 120 from the bottom of the second groove 122 and this part the lower electrode 10*a* is electrically coupled to the impurity layer 7 of the MOS transistor via the aluminum alloy wiring 14*a*. The upper electrode 12*a* is electrically coupled to the aluminum alloy wiring 14*b*.

According to the second embodiment described above, the capacitive element is formed as follows. Namely, the first groove 120 and the second groove 122 are formed in the first interlayer insulation film 9 and the lower electrode material film 10, the ferroelectric material film 11 and the upper electrode material film 12 are deposited in this order in the first groove 120 and the second groove 122. Then, the lower electrode material film 10, the ferroelectric material film 11 and the upper electrode material film 12 are removed from the first interlayer insulation film 9 by CMP polishing. At the same time, the ferroelectric material film 11 and the upper electrode material film 12 are removed from the first groove 120 and the second groove 122. Thus, the capacitive element including the lower electrode 10*a*, the ferroelectric film 11*a* and the upper electrode 12*a* is thereby formed. Hence, there are few particles since ion milling is not needed when forming the capacitive element by patterning the lower electrode material film 10, the ferroelectric film material film 11, and the upper electrode material film 12. Therefore, the upper electrode 12*a* and the lower electrode 10*a* can be restrained from short-circuiting and the aluminum alloy wiring 14*a* and 14*b* are also restrained from short-circuiting.

Further, it is not difficult to form a taper when patterning so as to miniaturize the capacitive element.

Figure 4A:
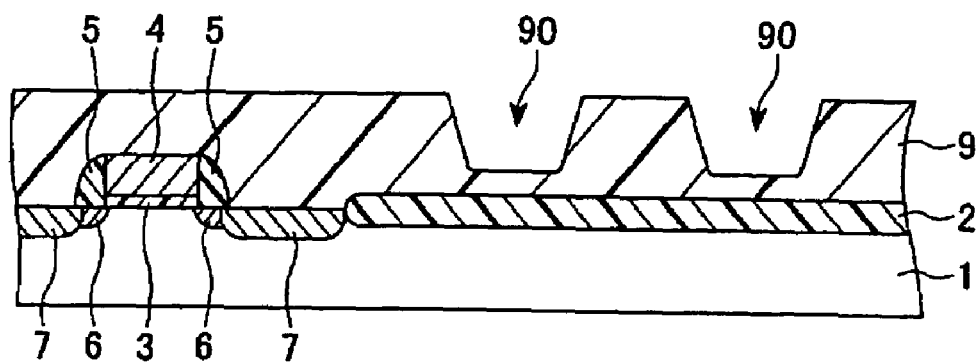
FIG. 4A and FIG. 4B show a method of manufacturing a semiconductor device of the third embodiment.
Figure 4B:
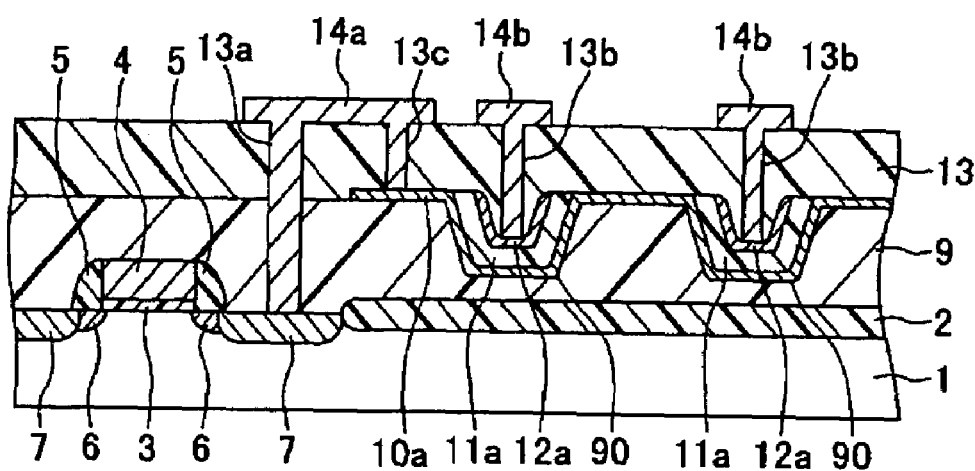

FIGS. 4A to 4B show cross sections of a method of manufacturing a semiconductor device of the third embodiment. The same reference numerals are applied to the same parts as in the first embodiment since this embodiment is almost the same as the first embodiment and only different portions are explained. Firstly, as shown in FIG. 4A, the element isolation film 2 and the MOS transistor are formed in a silicon substrate and the first interlayer insulation film 9 such as a silicon oxide film is deposited on an entire surface including the MOS transistor and the element isolation film 2. These processes are the same as in the first embodiment.

Next, the groove 90 is formed in the first interlayer insulation film 9. The process for forming the groove 90 is the same as in the first embodiment. Next, the lower electrode material film 10, the ferroelectric material film 11 and the upper electrode material film 12 are deposited in this order in a plurality of the grooves 90 and on the first interlayer insulation film 9. Then, parts of the ferroelectric material film 11 and the upper electrode material film 12 formed on the surface of the first interlayer insulation film 9 are polished and removed by CMP. Thus, as shown in FIG. 4*b*, the ferroelectric film 11*a* and the upper electrode 12*a* are formed in each of a plurality of the grooves 90 at the same time.

The semiconductor device shown in FIG. 4B is manufactured by the same process as in the first embodiment thereafter. Namely, a plurality of grooves 90 is formed in the first interlayer insulation layer 9. Within each of the grooves 90, the lower electrode 10*a*, the ferroelectric film 11*a* and the upper electrode 12*a* are formed in this order so as to form capacitive elements. One of the lower electrodes 10*a* is connected to another among a plurality of the grooves 90. Other constituents are the same as in the semiconductor device manufactured by the first embodiment.

The above third embodiment shows the same effect as the first embodiment. Further, a plurality of grooves 90 is formed in the interlayer insulation film 9 so as to form capacitive elements in the plurality of grooves 90 at the same time.

Figure 5A:
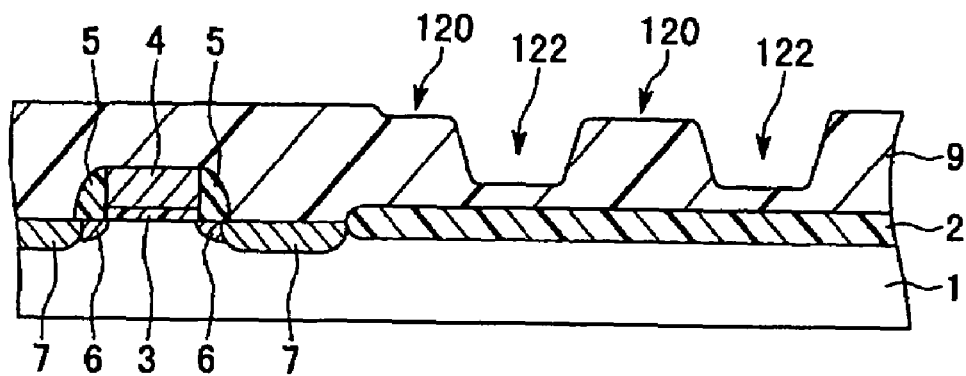
FIG. 5A and FIG. 5B show a method of manufacturing a semiconductor device of the fourth embodiment.
Figure 5B:
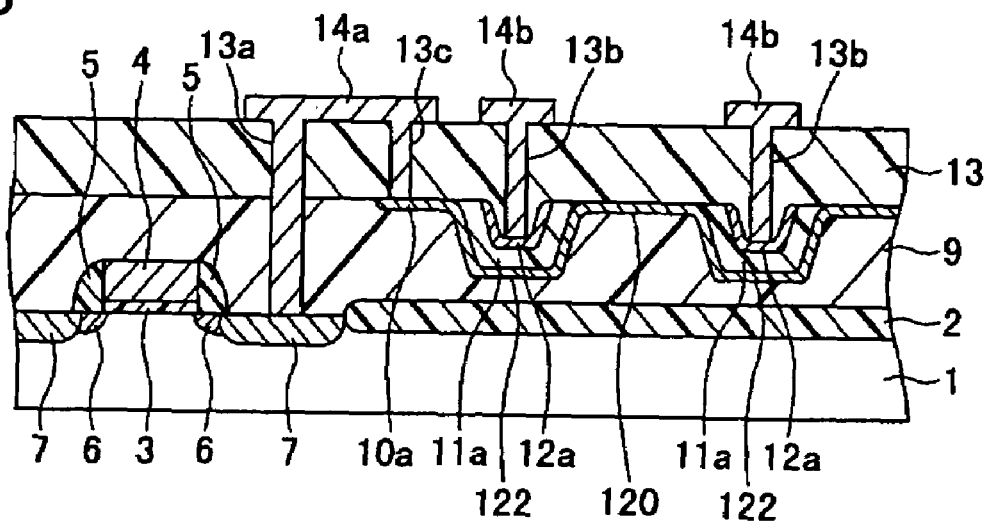
Figure 6:
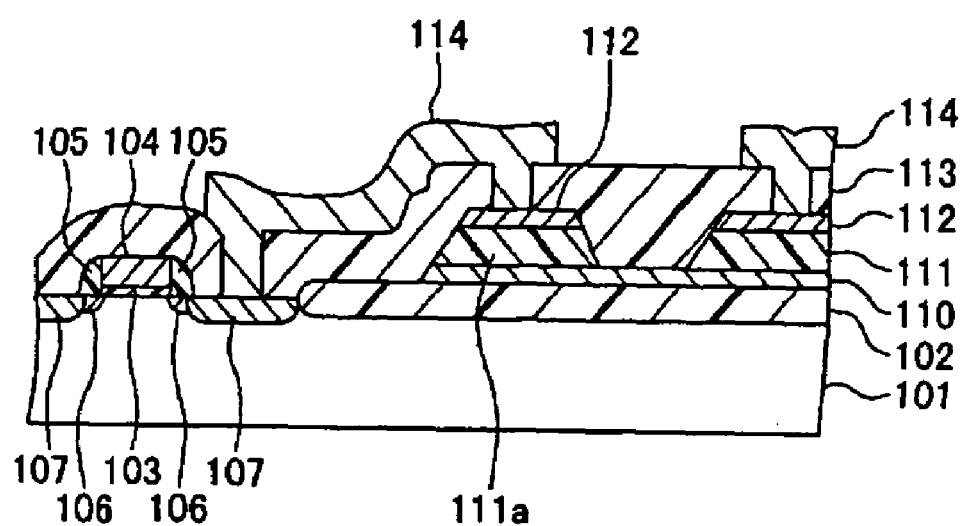
FIG. 6 shows a sectional view of a conventional semiconductor device.

FIGS. 5A to 5B show cross sections of a method of manufacturing a semiconductor device of the fourth embodiment of the invention. The same reference numerals are applied to the same parts as in the second embodiment since this embodiment is almost the same as the second embodiment and only different portions are explained. Firstly, as shown in FIG. 5A, the element isolation film 2 and the MOS transistor are formed in the silicon substrate 1 and the first interlayer insulation film 9 such as a silicon oxide film is deposited on an entire surface including the MOS transistor and the element isolation film 2. Next, first grooves 120 are formed in the first interlayer insulation film 9. These processes are the same as in the second embodiment.

Next, second grooves 122 are formed in the bottom of the first grooves 120. The process for forming the second groove 122 is the same as in the second embodiment. Further, the lower electrode material film 10, the ferroelectric material film 11 and the upper electrode material film 12 are deposited in this order in the first groove 120 and a plurality of the second grooves 122 and on the first interlayer insulation film 9. Then, parts of the ferroelectric material film 11 the upper electrode material film 12 and the lower electrode material film 10 formed on the surface of the first interlayer insulation film 9 are polished and removed by CMP. At this time, similar to the second embodiment, the upper electrode material film 12 and the ferroelectric material film 11 are removed from the surface of the first groove 120 so that the lower electrode 10a is exposed on the surface of the first groove 120. Thus, as shown in FIG. 5B, each of the capacitive elements is formed in each of a plurality of the grooves 120.

The semiconductor device shown in FIG. 5B is manufactured by the same process as in the second embodiment thereafter. Namely, a plurality of second grooves 122 is formed in the bottom of the first interlayer insulation film 9. Within each of the second grooves 122, the lower electrode 10a, the ferroelectric film 11a and the upper electrode 12a are formed in this order so as to form the capacitive element. One of the lower electrodes 10a is electrically connected to another among a plurality of the capacitive elements. Other constituents are the same as in the semiconductor device manufactured by the second embodiment.

The above fourth embodiment shows the same effect as the second embodiment. Further, a plurality of second grooves 122 is formed in the first grooves 120 so as to form each of the capacitive elements in each of the plurality of grooves 120.

The present invention is not limited to the above-mentioned embodiments and can be applied to various modifications within the spirit and scope of the invention.

The invention claimed is:

1. A method of manufacturing a semiconductor device, comprising:
   forming a groove having at least one tapered side in an insulation film;
   forming a lower electrode material film on the insulation film and in the groove;
   forming a ferroelectric material film on the lower electrode material film on the insulation film and within the groove;
   forming an upper electrode material film on the ferroelectric material film, on the insulation film and within the groove;
   forming an upper electrode and a ferroelectric material film of a capacitive element within the groove by removing the upper electrode material film and the ferroelectric material film from the insulation film and leaving the upper electrode material film and the ferroelectric material film within the groove by chemical-mechanical polishing the insulation film and the groove, wherein at least a part of the lower electrode material film on the insulation film is left continuous from the groove to form the lower electrode of the capacitor element.

2. The method of manufacturing a semiconductor device according to claim 1, wherein the step of forming the lower electrode material film includes a step of forming the lower electrode material film by one of sputtering and chemical vapor deposition.

3. The method of manufacturing a semiconductor device according to claim 1, wherein an interface between a side and a bottom of the groove is curved in the step of forming the groove.

4. A method of manufacturing a semiconductor device, comprising:
   forming a first groove in an insulation film;
   forming a second groove at a bottom of the first groove;
   forming a lower electrode material film on a surface of the insulation film and within the first and the second grooves;
   forming a ferroelectric material film at the insulation film, the first groove and the second groove;
   forming an upper electrode material film on the ferroelectric material film at the insulation film, the first groove and the second groove; and
   forming a capacitive element within the second groove and exposing the lower electrode material film at the first groove by removing the upper electrode material film, the ferroelectric material film and the lower electrode material film from the insulation film and removing the upper electrode material film and the ferroelectric material film from the first groove by CMP-polishing the insulation film, the first groove and the second groove,
   wherein at least one of the first groove and the second groove is tapered.

5. The method of manufacturing a semiconductor device according to claim 4, wherein a thickness of the lower electrode material film is made greater than a depth of the first groove in the step of forming the lower electrode material film.

6. The method of manufacturing a semiconductor device according to claim 4, wherein the lower electrode material film formed on the first groove is left continuous from the second groove in the step of removing the upper electrode material film and the ferroelectric film.

7. A semiconductor device having a capacitive element, comprising:
   a groove formed in an insulation film;
   a lower electrode formed continuous from at least a part of a surface of the insulation film to an inside of the groove;
   a ferroelectric film formed within the groove and on the lower electrode; and
   an upper electrode formed within the groove and on the ferroelectric film,
   wherein the groove is tapered.

8. A semiconductor device having a capacitive element, comprising:
   a first groove formed in an insulation film;
   a second groove formed at a bottom of the first groove;
   a lower electrode formed continuous from at least a part of a bottom surface of the first groove to an inside of the second groove;
   a ferroelectric film formed within the second groove and on the lower electrode; and
   an upper electrode formed within the second groove and on the ferroelectric film,
   wherein at least one of the first groove and the second groove is tapered.

9. A method of manufacturing a semiconductor device, comprising:
   forming a transistor on a substrate;
   forming an insulation film on the substrate;
   forming a groove in the insulation film;
   forming a lower electrode material film on the insulation film and within the groove;
   forming a ferroelectric material film on the lower electrode material film located on the insulation film and within the groove;
   forming an upper electrode material film on the ferroelectric material film located on the insulation film and within the groove;
   forming a capacitive element within the groove by removing the upper electrode material film and the ferroelectric material film from the insulation film and leaving the upper electrode material film and the ferroelectric material film within the groove by CMP-polishing the insulation film and the groove; and forming a wiring to electrically couple the capacitive element with the transistor.

10. A method of manufacturing a semiconductor device, comprising:
forming a transistor on a substrate;
forming an insulation film on the substrate;
forming a first groove in the insulation film;
forming a second groove at a bottom of the first groove;
forming a lower electrode material film on a surface of the insulation film and within the first and second grooves;
forming a ferroelectric material film on the lower electrode material film located on the insulation film and within the first and second grooves;
forming an upper electrode on the ferroelectric material film located on the insulation film and within the first and second grooves;
forming a capacitive element within the second groove and exposing the lower electrode material film at the first groove by removing the upper electrode material film, the ferroelectric material film and the lower electrode material film from the insulation film, and removing the upper electrode material film and the ferroelectric material film from the upper surface of the first groove by CMP-polishing the insulation film and the first and second grooves; and
forming a wiring to electrically couple the capacitive element to the transistor.

11. A semiconductor device comprising:
a transistor on a substrate;
an insulation film on the substrate;
a groove in the insulation film;
a lower electrode of a capacitive element continuous from at least a part of a surface of the insulation film to an inside of the groove;
a ferroelectric film of the capacitive element formed within the groove and on the lower electrode; and
an upper electrode of the capacitive element on the ferroelectric film and within the groove, wherein the capacitive element including the upper electrode, the ferroelectric film and the lower electrode is coupled to the transistor,
wherein the groove is tapered.

12. A semiconductor device comprising:
a transistor on a substrate;
an insulation film on the substrate;
a first groove on the insulation film;
a second groove at a bottom of the first groove;
a lower electrode continuous from at least a part of the bottom of the first groove to an inside of the second groove;
a ferroelectric film within the second groove and on the lower electrode; and
an upper electrode within the second groove and on the ferroelectric film, wherein the capacitive element including the upper electrode, the ferroelectric film and the lower electrode is coupled to a transistor.

* * * * *

UNITED STATES PATENT AND TRADEMARK OFFICE
CERTIFICATE OF CORRECTION

| | | |
|---|---|---|
| PATENT NO. | : 7,109,540 B2 | Page 1 of 1 |
| APPLICATION NO. | : 10/984673 | |
| DATED | : September 19, 2006 | |
| INVENTOR(S) | : Toshihiko Higuchi | |

It is certified that error appears in the above-identified patent and that said Letters Patent is hereby corrected as shown below:

Title Page: Add Item --(30) Foreign Application Priority Data, Nov 10, 2003 (JP) 2003-379265--:

| | |
|---|---|
| Column 2, Line 19: | "an" should be -- a -- |
| Column 2, Line 19: | "a" should be -- an -- |
| Column 2, Line 38: | "pattering" should be -- patterning -- |
| Column 2, Line 67: | "a" should be -- an --, second occurrence |
| Column 3, Line 21: | "pattering" should be -- patterning -- |
| Column 3, Line 62: | "comprises;" should be -- comprises: -- |
| Column 5, Line 22: | "an" should be -- and -- |
| Column 7, Line 46: | "14a" should be -- 14a. -- |
| Column 8, Line 28: | "followings." should be -- follows. -- |
| Column 9, Line 8: | delete "in" |
| Column 9, Line 63: | delete "film", second occurrence |
| Column 10, Line 63: | "11" should be -- 11, -- |

Signed and Sealed this

Seventeenth Day of July, 2007

JON W. DUDAS
*Director of the United States Patent and Trademark Office*